United States Patent
Ho (10) Patent No.: US 10,867,663 B2
(45) Date of Patent: Dec. 15, 2020

(54) CONTROL METHOD FOR MEMORY AND NON-TRANSITORY COMPUTER-READABLE MEDIA

(71) Applicant: Winbond Electronics Corp., Taichung (TW)

(72) Inventor: Wen-Chiao Ho, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/526,153

(22) Filed: Jul. 30, 2019

(65) Prior Publication Data

US 2020/0168265 A1    May 28, 2020

(30) Foreign Application Priority Data

Nov. 28, 2018 (TW) .............................. 107142449 A (51) Int. Cl.
| | | |
|---|---|---|
| *G11C 11/409* | (2006.01) | |
| *G06F 9/30* | (2018.01) | |
| *G06F 13/16* | (2006.01) | |
| *G06F 11/10* | (2006.01) | |

(52) U.S. Cl.
CPC ........ *G11C 11/409* (2013.01); *G06F 9/30018* (2013.01); *G06F 11/1016* (2013.01); *G06F 13/1668* (2013.01)

(58) Field of Classification Search
CPC ............... G11C 11/409; G06F 9/30018; G06F 11/1016; G06F 13/1668
USPC .................................................. 365/189.011
See application file for complete search history.

(56) References Cited

U.S. PATENT DOCUMENTS

| | | | |
|---|---|---|---|
| 2015/0254136 A1* | 9/2015 | Hoya | .................. G06F 11/1012 714/764 |
| 2016/0350178 A1* | 12/2016 | Lien | ........................ G11C 29/44 |
| 2016/0350183 A1* | 12/2016 | Lien | ........................ G06F 3/0619 |
| 2018/0076828 A1 | 3/2018 | Kanno | |
| 2018/0091172 A1* | 3/2018 | Ilani | ..................... G06F 11/1012 |
| 2019/0034266 A1* | 1/2019 | Terada | ................ G06F 11/3037 |
| 2020/0082900 A1* | 3/2020 | Amato | ................... G11C 29/44 |

* cited by examiner

*Primary Examiner* — Sung Il Cho
(74) *Attorney, Agent, or Firm* — Muncy, Geissler, Olds & Lowe, P.C.

(57) ABSTRACT

A control method for a memory is provided. External data is received. An error correct code scheme is performed on the external data to generate first parity data. The number of logic values equal to a specific logic value in the external data and the first parity data is calculated to generate a calculation result. First reverse data is generated according to the calculation result and tendency data. The external data and the first parity data are inverted and the inverted external data, the inverted first parity data and the first reverse data are written into a cell array in response to the calculation result and the tendency data matching a predetermined condition. The external data, the first parity data and the first reverse data are written into the cell array in response to the calculation result and the tendency data not matching the predetermined condition.

12 Claims, 5 Drawing Sheets

CONTROL METHOD FOR MEMORY AND NON-TRANSITORY COMPUTER-READABLE MEDIA

CROSS REFERENCE TO RELATED APPLICATIONS

This application claims priority of Taiwan Patent Application No. 107142449, filed on Nov. 28, 2018, the entirety of which is incorporated by reference herein.

BACKGROUND OF THE INVENTION

Field of the Invention

The invention relates to a control method, and more particularly to a control method for memory.

Description of the Related Art

To improve the accuracy of data, before the data is written into memory, an error correction code scheme is performed for the data to generate many parity bits. Then, the data with the parity bits are written into the memory. However, the parity bits occupy a large space in memory.

Taking 64 bits of the data as an example, the number of parity bits is 7 to correct 1-bit-error. When the number of parity bits is 14, 2-bits-error can be corrected. When the number of parity bits is 21, 3-bits-error can be corrected. In this case, the parity bits occupy 33% of the memory size.

BRIEF SUMMARY OF THE INVENTION

In accordance with an embodiment, a control method for a memory is described in the following paragraph. External data is received. An error correct code scheme is performed on the external data to generate first parity data. The number of logic values equal to a specific logic value in the external data and the first parity data is calculated to generate a calculation result. First reverse data is generated according to the calculation result and tendency data. The external data and the first parity data are inverted and the inverted external data, the inverted first parity data and the first reverse data are written into a cell array in response to the calculation result and the tendency data matching a predetermined condition. The external data, the first parity data and the first reverse data are written into the cell array in response to the calculation result and the tendency data not matching the predetermined condition.

A non-transitory computer readable media is also provided. The non-transitory computer readable media stores a plurality of logic commands. In response to the logic commands being executed by a memory controller coupled to a cell array, the logic commands direct the memory controller to perform the following steps: receiving external data; performing an error correct code scheme to generate first parity data; calculating the number of logic values equal to a specific logic value in the external data and the first parity data to generate a calculation result; generating first reverse data according to the calculation result and tendency data; inverting the external data and the first parity data to generate write data and writing the write data and the first reverse data into the cell array in response to the calculation result and the tendency data matching a predetermined condition; and writing the external data, the first parity data and the first reverse data into the cell array in response to the calculation result and the tendency data not matching the predetermined condition.

Control methods may be practiced by a memory system which have hardware or firmware capable of performing particular functions and may take the form of program code embodied in a tangible media. When the program code is loaded into and executed by an electronic device, a processor, a computer or a machine, the electronic device, the processor, the computer or the machine becomes an apparatus for practicing the disclosed method.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1:
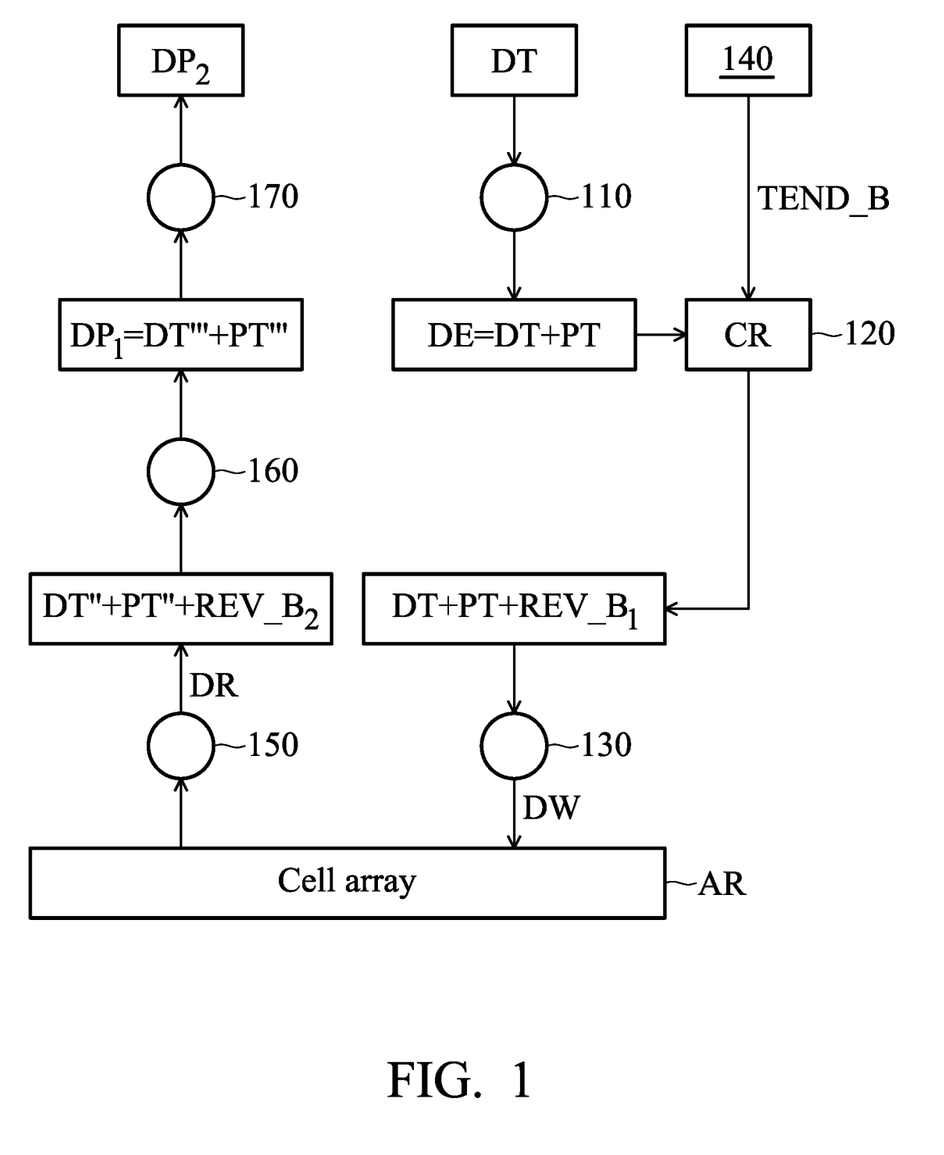
FIG. 1 is a flowchart of an exemplary embodiment of a control method for a memory according to various aspects of the present disclosure.

Refer to FIG. 1, an error correction check (ECC) scheme 110 is performed on external data DT to encode the external data DT and generate parity data PT. Assuming that the external data DT has m bits and the parity data PT has n bits, wherein n and m are positive integers. In this embodiment, the external data DT and the parity data PT are referred to as encoded data DE.

A reverse check operation 120 receives the encoded data DE to determine the tendency of the encoded data DE. In order words, the reverse check operation 120 determines the number of logic values equal to 1 in the external data DT and the parity data PT and the number of logic values equal to 0 in the external data DT and the parity data PT. The reverse check operation 120 further receives tendency data TEND_B. The tendency data TEND_B represents the tendency of the cell array AR. In other words, when the cell array AR is read, the logic value of the read data trends towards to a logic value 1 or a logic value 0. The reverse check operation 120 generates reverse data $REV\_B_1$ according to the encoded data DE and the tendency of the cell array AR.

For example, when the tendency of the encoded data DE is different from the tendency of the cell array AR, the reverse check operation 120 sets the reverse data REV_B$_1$ to a first logic value. When the tendency of the encoded data DE is the same as the tendency of the cell array AR, the reverse check operation 120 sets the reverse data REV_B$_1$ to a second logic value. The first logic value is opposite to the second logic value. For example, when the first logic value is the logic value 1, the second logic value is the logic value 0.

In one embodiment, the reverse check operation 120 calculates the number of logic values equal to the logic value 1 in the external data DT and the parity data PT to generate a calculation result CR. In one embodiment, when the number of logic values equal to the logic value 1 in the external data DT and the parity data PT is larger than (m+n)/2, the calculation result CR is a first value (e.g., 1). When the number of logic values equal to the logic value 1 in the external data DT and the parity data PT is not larger than (m+n)/2, the calculation result CR is a second value (e.g., 0).

In this embodiment, the reverse check operation 120 determines that the read data trends towards the logic value 1 or the logic value 0 according to the tendency data TEND_B when the cell array AR is read. The tendency of the data output from the cell array AR relates to many factors. For example, the data output from the cell array AR trends towards to the logic value 1 when the charge of the memory (e.g., DRAM) is lost, the internal read signal of the memory is easily interfered to a high level, disturbance phenomena occurs at the memory, or the temperature of the memory is too high or too low. Additionally, the data output from the memory trends towards the logic value 0 when the charge gain of the memory is increased, or the internal read signal of the memory is easy to be pulled down. In other embodiments, the tendency of the data output from the memory relates to the reliability of the memory.

In this embodiment, the tendency data TEND_B is generated by a tendency check operation 140. The tendency check operation 140 is a test operation for a memory chip. During the test operation, the memory chip is accessed many times in different operation environments (e.g., high temperature or low temperature). After accessing the memory chip many times, the performance parameters of the memory chip are determined. Furthermore, the reliability of the memory chip is obtained after accessing the memory chip for a long time. The test operation can not only obtain the performance parameters and the reliability of the memory chips but also define the tendency data TEND_B according to the read result of the memory chip. For example, assuming that the read data output from the memory trends towards the logic value 1 when the memory is read. In this case, the tendency data TEND_B is set to a first value (e.g., the logic 1). After the memory is read, when the read data output from the memory trends towards to the logic value 0, the tendency data TEND_B is set to a second value (e.g., the logic 0). In another embodiment, the test operation is performed in a stage of testing a wafer. In this case, the test operation is a first test for the memory chip.

In other embodiments, the tendency check operation 140 executes an internal algorithm to generate the tendency data TEND_B. The time executing the internal algorithm is not limited in the disclosure. In one embodiment, the internal algorithm is executed one time. In this case, the tendency data TEND_B is stored in a non-volatile memory. When the non-volatile memory is powered up again, it is not required to perform the tendency check operation 140 again. In some embodiments, when the tendency data TEND_B is stored in a volatile memory, if the volatile memory is powered up again, the tendency check operation 140 is required to be performed first and then accessing operation is performed normally.

In this embodiment, the reverse check operation 120 determines whether the calculation result CR and the tendency data TEND_B match a predetermined condition. When the calculation result CR and the tendency data TEND_B match the predetermined condition, it means that the tendency of the cell array AR is different from the tendency of the encoded data DE. Therefore, the reverse check operation 120 sets the reverse data REV_B$_1$ at a first logic value (e.g., the logic value 1). When the calculation result CR and the tendency data TEND_B do not match the predetermined condition, it means that the tendency of the cell array AR is the same as the tendency of the encoded data DE. Therefore, the reverse check operation 120 sets the reverse data REV_B$_1$ at a second logic value (e.g., the logic value 0).

The write operation 130 generates write data D2 according to the reverse data REV_B$_1$ and stores the write data DW in the cell array AR. For example, when the reverse data REV_B$_1$ is at the first logic value, it means that the tendency of the cell array AR is different from the tendency of the encoded data DE. Therefore, the write operation 130 inverts the external data DT and the parity data PT and uses the inverted result and the reverse data REV_B$_1$ as the write data DW. However, when the reverse data REV_B$_1$ is at the second logic value, it means that the tendency of the cell array AR is the same as the tendency of the encoded data DE. Therefore, the write operation 130 directly uses the external data DT, the parity data PT and the reverse data REV_B$_1$ as the write data DW.

The read operation 150 reads the data stored in the cell array AR to generate read data DR. In this embodiment, the read data DR has data DT", parity data PT" and reverse data REV_B$_2$. In one embodiment, the data DT" has m bits and the parity data PT" has n bits.

The reverse check operation 160 receives the read data DR and generates processed data DP$_1$ according to the reverse data REV_B$_2$. In one embodiment, when the reverse data REV_B$_2$ is equal to a predetermined value (e.g., a first logic value), the reverse check operation 160 inverts the data DT" and the parity data PT" and uses the inverted result as the processed data DP$_1$. In this case, the symbol DT''' represents a result that the reverse check operation 160 inverts the inverted data DT" and the symbol PT''' represents a result that the reverse check operation 160 inverts the parity data PT". When the reverse data REV_B$_2$ is not equal to the predetermined value, the reverse check operation 160 directly uses the data DT" and the parity data PT" as the processed data DP$_1$. At this time, the symbol DT''' represents the data DT" and the symbol PT''' represents the parity data PT".

The ECC operation 170 decodes the data DT''' to generate processed data DP$_2$ according to the parity data PT'''. In one embodiment, assuming that the write operation 130 writes the write data DW into a specific storage unit of the cell array AR according to a specific address. In this case, when the read operation 150 reads the specific storage unit according to the specific address, the processed data DP$_2$ is equal to the external data DT.

In one embodiment, each of the operations 110~170 comprises many logic commands. The logic commands are stored in a non-transitory computer readable media and executed by a memory controller. The memory controller accesses a cell array (e.g., AR) according to the logic commands. In other embodiments, the ECC operation 110, the reverse check operation 120 and the write operation 130 are executed in a write mode, and the read operation 150, the reverse check operation 160 and the ECC operation 170 are executed in a read mode. Furthermore, the tendency check operation 140 is executed in a test mode.

Figure 2A:
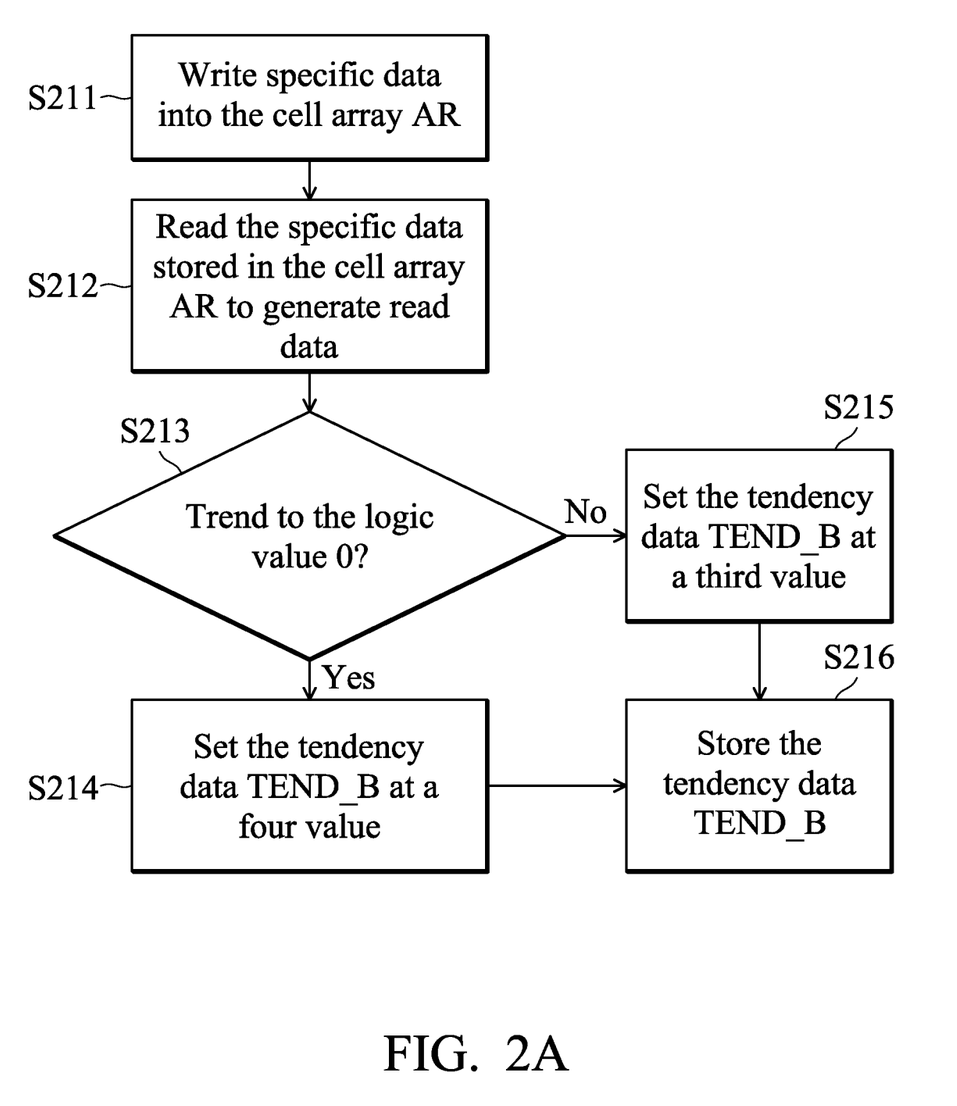
FIG. 2A is a flowchart of an exemplary embodiment of a tendency check operation according to various aspects of the present disclosure.

Referred to FIG. 2A, in one embodiment, the tendency check operation 140 is executed by a memory controller. First, specific data is written into the cell array AR (step S211). Next, the specific data stored in the cell array AR is read to generate read data (step S212).

Then, the specific data is compared with the read data to determine whether the read data trends to the logic value 0 when the cell array AR is read (step S213). In one embodiment, step S213 is to execute a bitwise operation on the specific data and the read data to generate a first count and a second count. The first count represents the number of error bits that the read data is the logic value 1 and the specific data is the logic value 0. In other words, the first count is the number of erroneous 1's occurring in the cell array AR. The second count represents the number of error bits that the read data is the logic value 0 and the specific data is the logic value 1. In other words, the second count is the number of erroneous 0's occurring in the cell array AR.

When the number of erroneous 1's occurring in the cell array AR is larger than a predetermined value, it means that the read data output from the cell array AR trends to the logic value 1 when the cell array AR is read. Therefore, the tendency data TEND_B is set at a third value (step S215) and the tendency data TEND_B is stored (step S216). When the number of erroneous 1's occurring in the cell array AR is smaller than the predetermined value, it means that the read data output from the cell array AR trends to the logic value 0 when the cell array AR is read. Therefore, the tendency data TEND_B is set at a fourth value (step S214) and the tendency data TEND_B is stored (step S216). In one embodiment, the predetermined value is half of the specific data.

Figure 2B:
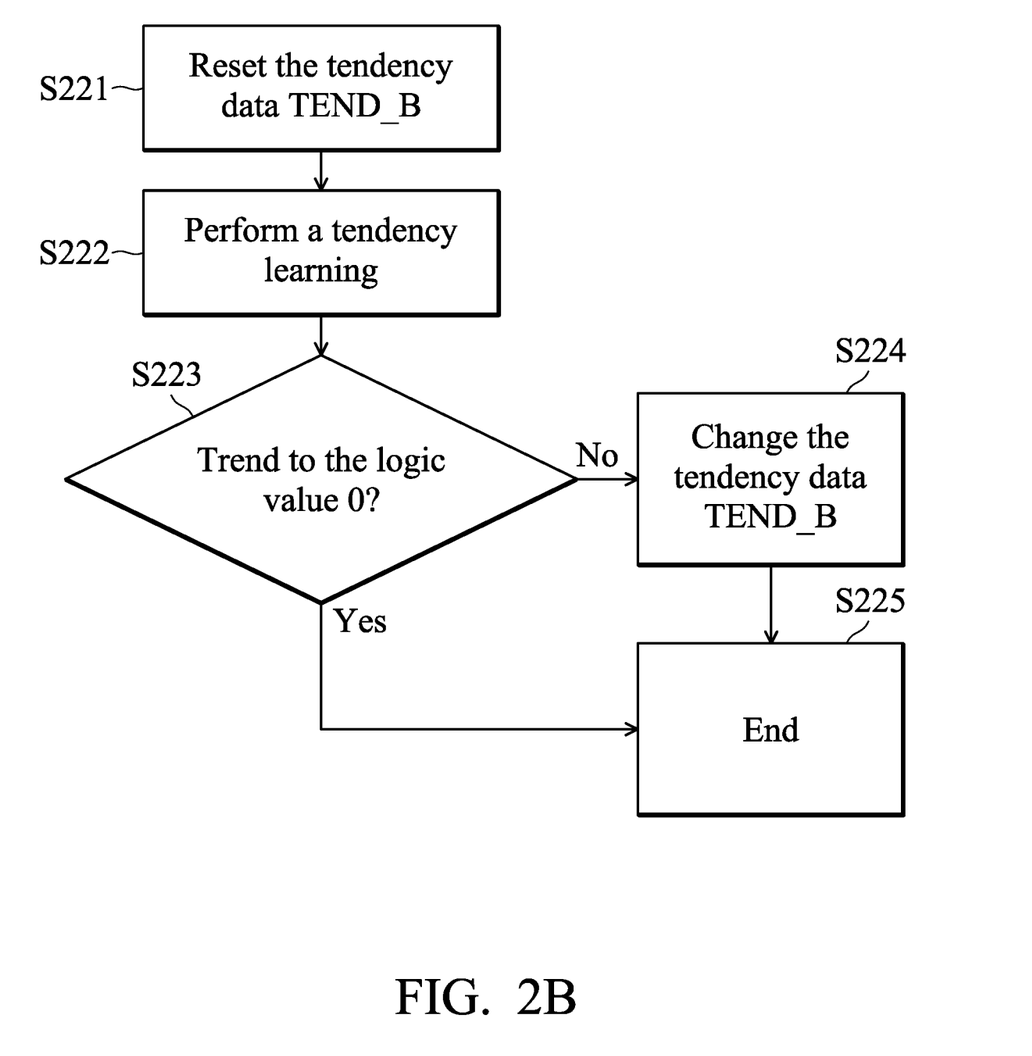
FIG. 2B is a flowchart of another exemplary embodiment of the tendency check operation according to various aspects of the present disclosure.

In other embodiments, referred to FIG. 2B, the tendency data TEND_B is reset first (step S221). The tendency data TEND_B may be reset to the logic value 0 or the logic value 1. In this embodiment, the tendency data TEND_B is reset to the logic value 0 first.

A tendency learning is performed to determine the number of erroneous 1's occurred at the cell array AR (step S222). In one embodiment, step S222 comprises steps S211 and S212 of FIG. 2A. Since the operations of steps S211 and S212 have been described above, the descriptions of the operations of steps S211 and S212 are omitted.

A determination is made as to whether the cell array AR trends to read-out the logic value 0 (step S223). Since step S223 is similar to step S213, the description of step S223 is omitted. When the cell array AR trends to read-out the logic value 0, the reverse check operation 140 is ended (step S225). However, when the cell array AR does not trend to read-out the logic value 0, the tendency data TEND_B is changed (step S224). For example, if the tendency data TEND_B is reset at the logic value 0 in step S221, the tendency data TEND_B is changed to the logic value 1 in step S224. Additionally, if the tendency data TEND_B is reset at the logic value 1 in step S221, when the cell array AR trends to read-out the logic value 0, the tendency data TEND_B is changed to the logic value 0. However, when the cell array AR does not trend to read-out the logic value 0, the tendency data TEND_B is maintained at the logic value 1 and the reverse check operation 140 is ended.

Figure 3:
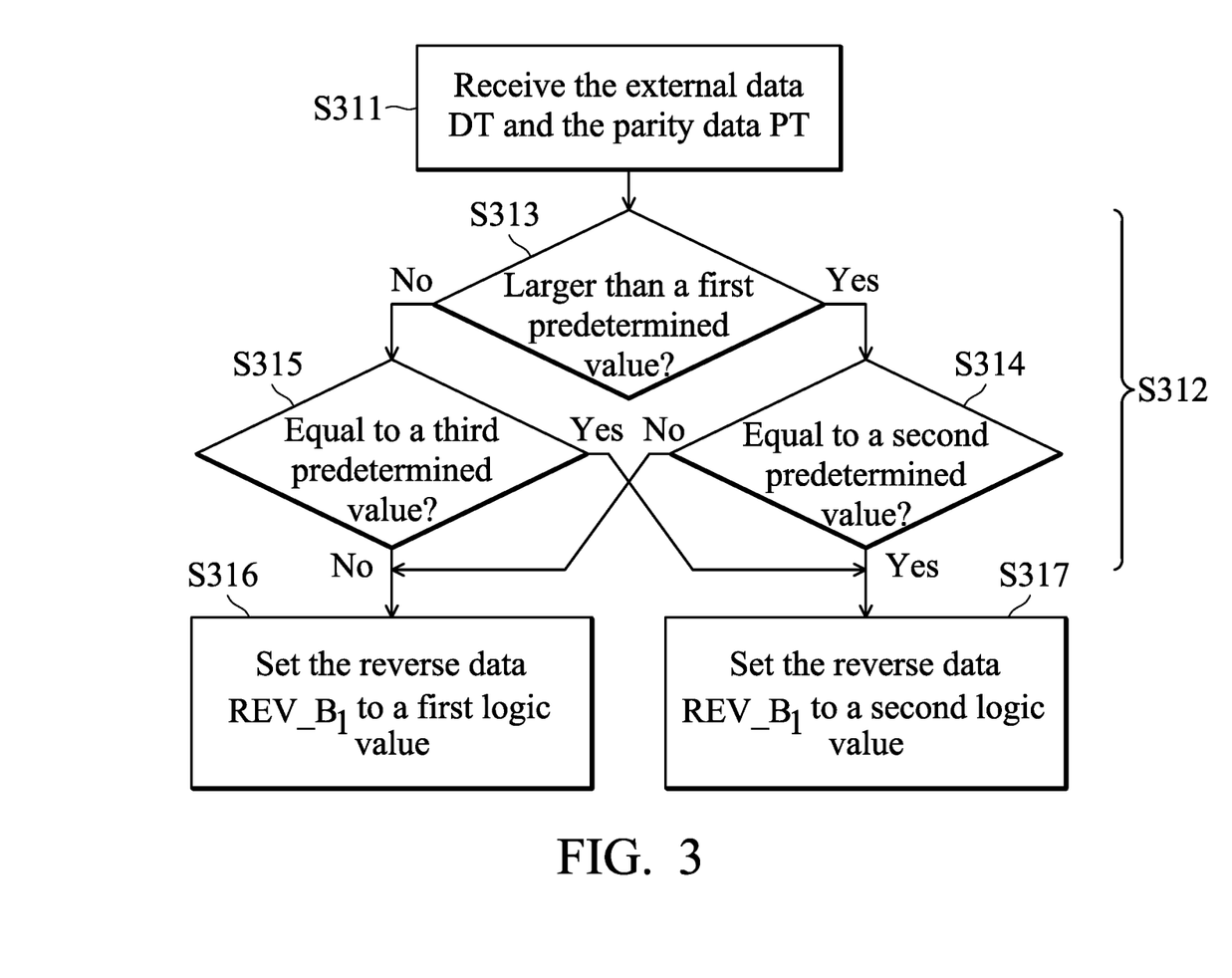
FIG. 3 is a flowchart of an exemplary embodiment of a reverse check operation according to various aspects of the present disclosure.

Referred to FIG. 3, in one embodiment, the reverse check operation 120 is executed by a memory controller. First, the external data DT and the parity data PT are received (step S311). In one embodiment, the external data DT has m bits, and the parity data PT has n bits.

A determination is made as to whether a reverse operation has been performed (step S312). In this embodiment, step S312 comprises steps S313~S315. Step S313 is to determine whether the number of logic values equal to the logic value 1 in the external data DT and the parity data PT is larger than a first predetermined value. In one embodiment, the first predetermined value is (m+n)/2. When the number of logic values equal to the logic value 1 in the external data DT and the parity data PT is larger than the first predetermined value, a determination is made as to whether the tendency data TEND_B is equal to a second predetermined value (step S314). In this embodiment, the second predetermined value is the logic value 1. When the tendency data TEND_B is not equal to the second predetermined value, it means that the data output from the cell array AR trends towards to the logic value 0. Therefore, the reverse data REV_$B_1$ is set to a first logic value (step S316).

However, when the tendency data TEND_B is equal to the second predetermined value, it means that the data output from the cell array AR trends towards to the logic value 1. Therefore, the reverse data REV_$B_1$ is set to a second logic value (step S317).

When the number of logic values equal to the logic value 1 in the external data DT and the parity data PT is not larger than the first predetermined value, a determination is made as to whether the tendency data TEND_B is equal to a third predetermined value (step S315). In this embodiment, the third predetermined value is the logic value 0. When the tendency data TEND_B is not equal to the third predetermined value, it means that the data output from the cell array AR trends towards to the logic value 1. Therefore, the reverse data REV_$B_1$ is set to the first logic value (step S316). However, when the tendency data TEND_B is equal to the third predetermined value, it means that the data output from the cell array AR trends towards the logic value 0 when the cell array AR is read. Therefore, the reverse data REV_$B_1$ is set to the second logic value (step S317).

In other embodiments, step S315 is the same as step S314 to determine whether the tendency data TEND_B is equal to the second predetermined value. In this case, when step S315 determines that the tendency data TEND_B is equal to the second predetermined value, step S316 is executed. When step S315 determines that the tendency data TEND_B is not equal to the second predetermined value, step S317 is executed.

Figure 4:
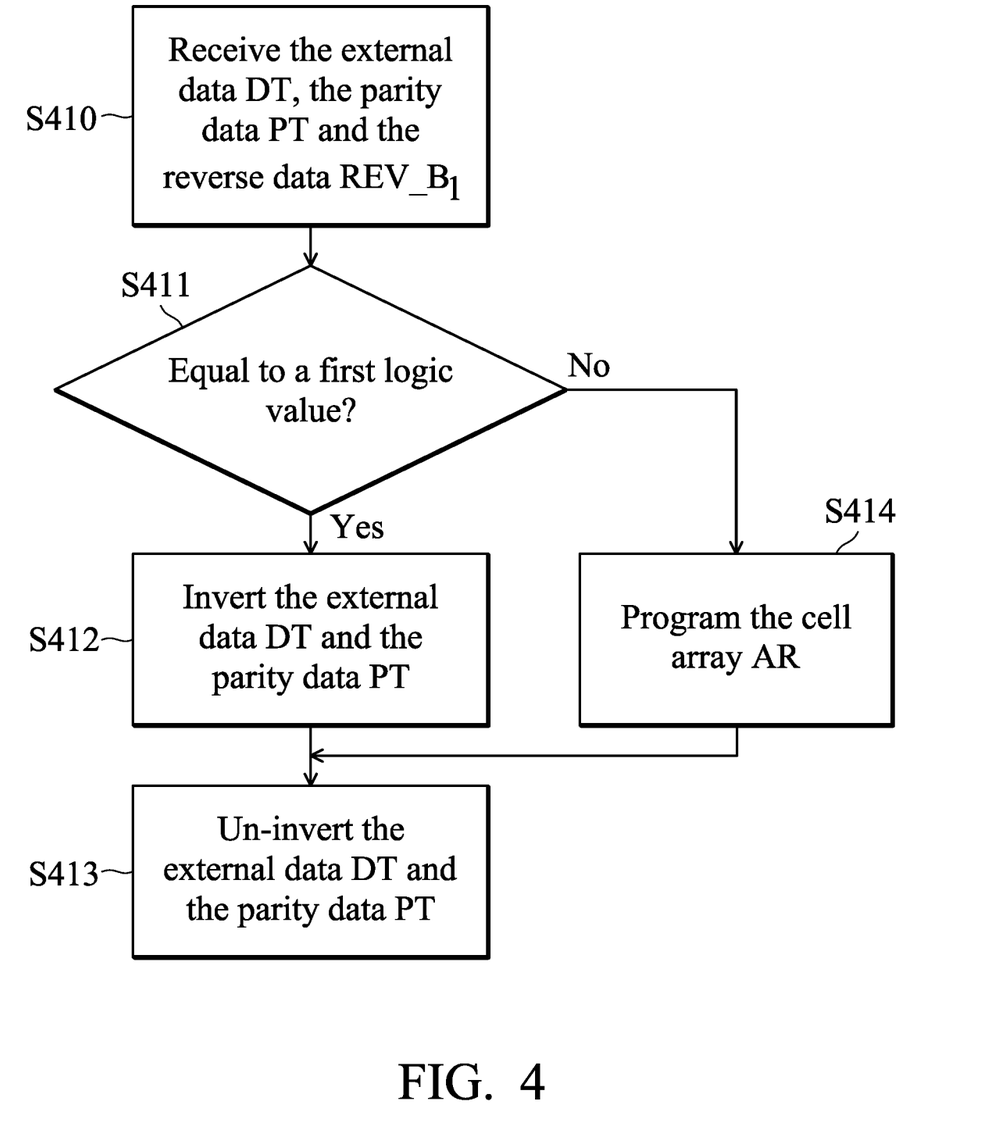
FIG. 4 is a flowchart of an exemplary embodiment of a write operation according to various aspects of the present disclosure.

Referred to FIG. 4, the external data DT, the parity data PT and the reverse data REV_$B_1$ are received first (step S410). Then, a determination is made as to whether the reverse data REV_$B_1$ is equal to a first logic value (step S411). When the reverse data REV_$B_1$ is equal to the first logic value (e.g., the logic value 1), the external data DT and the parity data PT are inverted to generate a reverse result and then the reverse result and the reverse data REV_$B_1$ serve as first write data (step S412). When the reverse data REV_$B_1$ is not equal to the first logic value, the external data DT, the parity data PT and the reverse data REV_$B_1$ serve as second write data (step S414). In one embodiment, the reverse data REV_$B_1$ has a bit, but the disclosure is not limited thereto. In other embodiments, the reverse data REV_$B_1$ has more bits.

Next, the cell array AR is programmed to write the first write data or the second write data to the cell array AR (step S413). In one embodiment, the write operation 130 writes the reverse data REV_B$_1$ into a first storage unit and a second storage unit. The reverse data REV_B$_1$ may comprise one bit which has the logic value 0 or the logic value 1. In this case, the read operation 150 reads the first storage unit to obtain first read-out data, reads the second storage unit to obtain second read-out data, and generates reverse data REV_B$_2$ according to the first and second read-out data.

For example, when each of the first and second read-out data is equal to a predetermined value (e.g., the logic value 1), it means that the reverse data REV_B$_1$ stored in the first and second storage units is a first logic value. Therefore, the read operation 150 sets the reverse data REV_B$_2$ to the first logic value (e.g., 1). When each of the first and second read-out data is not equal to the predetermined value, it means that the reverse data REV_B$_1$ stored in the first and second storage units is a second logic value. Therefore, the read operation 150 sets the reverse data REV_B$_2$ to the second logic value (e.g., 0).

Additionally, when the first read-out data is different from the second read-out data, the read operation 150 sets the reverse data REV_B$_2$ according to the tendency data TEND_B. For example, assuming that the first read-out data is the logic value 0 and the second read-out data is the logic value 1. At this time, if the tendency data TEND_B is equal to a first value (e.g., the logic value 1), it means that the probability that the data stored in the first and second storage units is the logic value 0 is high. Therefore, even if the second read-out data is the logic value 1, the read operation 150 sets the reverse data REV_B$_2$ to the second logic value (e.g., the logic value 0). However, if the tendency data TEND_B is equal to a second value (e.g., the logic value 0), it means that the probability that the data stored in the first and second storage units is the logic value 1 is high. Therefore, even if the first read-out data is the logic value 0, the read operation 150 sets the reverse data REV_B$_2$ to the first logic value (e.g., the logic value 1).

Since the cell array AR is programmed according to the tendencies of the external data DT and the cell array AR, when the cell array AR is read, the read error is not easily to occur. Therefore, the bit number of parity data PT is reduced to reduce the size of the cell array AR.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A control method for a memory, comprising:
receiving external data;
performing an error correct code scheme on the external data to generate first parity data;
calculating the number of logic values equal to a specific logic value in the external data and the first parity data to generate a calculation result;
performing a tendency check operation to set tendency data;
generating first reverse data according to the calculation result and the tendency data,
wherein the external data and the first parity data are inverted and the inverted external data, the inverted first parity data and the first reverse data are written into a cell array in response to the calculation result and the tendency data matching a predetermined condition, and
wherein the external data, the first parity data and the first reverse data are written into the cell array in response to the calculation result and the tendency data not matching the predetermined condition,
wherein the tendency check operation comprises:
writing specific data into the cell array;
reading the specific data stored in the cell array to generate read data;
performing a bitwise operation on the specific data and the read data to generate a first count and a second count, wherein the first count represents the number of logic values equal to 1 in the read data and logic values equal to 0 in the specific data, and the second count represents the number of logic values equal to 0 in the read data and logic values equal to 1 in the specific data; and
setting the tendency data according to the first count and the second count.

2. The control method as claimed in claim 1, wherein responsive to the calculation result not matching the tendency data, the calculation result and the tendency data do not match the predetermined condition, and responsive to the calculation result matching the tendency data, the calculation result and the tendency data do not match the predetermined condition.

3. The control method as claimed in claim 1, further comprising:
storing the tendency data in a volatile memory, wherein in response to the volatile memory being powered up again, the tendency check operation is performed again.

4. The control method as claimed in claim 1, further comprising:
storing the tendency data in a volatile memory or a non-volatile memory.

5. The control method as claimed in claim 1, further comprising:
reading the cell array to generate read data, wherein the read data has first data, second parity data and second reverse data;
determining whether the second reverse data is equal to a predetermined value;
in response to the second reverse data being equal to the predetermined value,
inverting the first data and the second parity data to generate inverted first data and inverted second parity data;
decoding the inverted first data according to the inverted second parity data to generate first processed data; and
outputting the first processed data to an external device; and in response to the second reverse data not being equal to the predetermined value, decoding the first data according to the second parity data to generate second processed data; and outputting the second processed data to the external device.

6. The control method as claimed in claim 5, wherein the step of determining whether the second reverse data is equal to the predetermined value comprises:

reading a first logic value stored in a first storage unit of the cell array;

reading a second logic value stored in a second storage unit of the cell array, wherein responsive to the first logic value and the second logic value being equal to the predetermined value, the second reverse data is equal to the predetermined value, and responsive to the first logic value and the second logic value not being equal to the predetermined value, the second reverse data is not equal to the predetermined value; and determining whether the tendency data is equal to the predetermined value in response to the first logic value not being equal to the second logic value, wherein responsive to the tendency data being equal to the predetermined value, the second reverse data is not equal to the predetermined value, and responsive to the tendency data not being equal to the predetermined value, the second reverse data is equal to the predetermined value.

7. A non-transitory computer readable media storing a plurality of logic commands, wherein in response to the logic commands being executed by a memory controller coupled to a cell array, the logic commands direct the memory controller to perform steps comprising:

receiving external data;

performing an error correct code scheme to generate first parity data;

calculating the number of logic values equal to a specific logic value in the external data and the first parity data to generate a calculation result;

perform a tendency check operation to set tendency data generating first reverse data according to the calculation result and the tendency data;

inverting the external data and the first parity data to generate write data and writing the write data and the first reverse data into the cell array in response to the calculation result and the tendency data matching a predetermined condition; and writing the external data, the first parity data and the first reverse data into the cell array in response to the calculation result and the tendency data not matching the predetermined condition, wherein the tendency check operation comprises:

writing specific data into the cell array;

reading the specific data stored in the cell array to generate read data;

performing a bitwise operation on the specific data and the read data to generate a first count and a second count, wherein the first count represents the number of logic values equal to 1 in the read data and logic values equal to 0 in the specific data, and a second count represents the number of logic values equal to 0 in the read data and logic values equal to 1 in the specific data; and setting the tendency data according to the first count and the second count.

8. The non-transitory computer readable media as claimed in claim 7, wherein in response to the calculation result matching the tendency data, the calculation result and the tendency data match the predetermined condition, and in response to the calculation result not matching the tendency data, the calculation result and the tendency data do not match the predetermined condition.

9. The non-transitory computer readable media as claimed in claim 7, wherein the logic commands direct the memory controller to store the tendency data in a volatile memory, and in response to the volatile memory being powered up again, the tendency check operation is performed again.

10. The non-transitory computer readable media as claimed in claim 7, wherein the logic commands direct the memory controller to perform step comprising:

storing the tendency data in a volatile memory or a non-volatile memory.

11. The non-transitory computer readable media as claimed in claim 7, wherein the logic commands direct the memory controller to perform steps comprising:

reading the cell array to generate a read data, wherein the read data has first data, second parity data and second reverse data;

determining whether the second reverse data is equal to a predetermined value, in response to the second reverse data being equal to the predetermined value, inverting the first data and the second reverse data to generate inverted first data and inverted second reverse data;

decoding the inverted first data according to the inverted second parity data to generate first processed data; and outputting the first processed data to an external device; and in response to the second reverse data not being equal to the predetermined value, decoding the first data according to the second parity data to generate second processed data; and outputting the second processed data to the external device.

12. The non-transitory computer readable media as claimed in claim 11, wherein the step of determining whether the second reverse data is equal to the predetermined value comprises:

reading a first logic value stored in a first storage unit of the cell array;

reading a second logic value stored in a second storage unit of the cell array, wherein in response to the first logic value and the second logic value being equal to the predetermined value, the second reverse data is equal to the predetermined value, and in response to the first logic value and the second logic value not being equal to the predetermined value, the second reverse data is not equal to the predetermined value; and determining whether the tendency data is equal to the predetermined value in response to the first logic value not being equal to the second logic value, wherein in response to the tendency data being equal to the predetermined value and the first logic value is not equal to the second logic value, the second reverse data is equal to the predetermined value, and in response to the tendency data not being equal to the predetermined value and the first logic value is not equal to the second logic value, the second reverse data is not equal to the predetermined value.

* * * * *